(12) United States Patent
Lee et al.

(10) Patent No.: US 10,312,355 B2
(45) Date of Patent: *Jun. 4, 2019

(54) TUNNEL FIELD-EFFECT TRANSISTOR (TFET) WITH LATERAL OXIDATION

(71) Applicant: The Board of Regents of The University of Texas System, Austin, TX (US)

(72) Inventors: Jack C. Lee, Austin, TX (US); Han Zhao, Austin, TX (US)

(73) Assignee: The Board of Regents of the University of Texas System, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/833,579

(22) Filed: Dec. 6, 2017

(65) Prior Publication Data

US 2018/0108761 A1    Apr. 19, 2018

Related U.S. Application Data

(63) Continuation of application No. 15/006,818, filed on Jan. 26, 2016, now Pat. No. 9,853,135, which is a continuation of application No. 13/274,001, filed on Oct. 14, 2011, now Pat. No. 9,293,591.

(51) Int. Cl.
| | |
|---|---|
| *H01L 29/06* | (2006.01) |
| *H01L 29/08* | (2006.01) |
| *H01L 29/66* | (2006.01) |
| *H01L 29/786* | (2006.01) |

(52) U.S. Cl.
CPC .... *H01L 29/66977* (2013.01); *H01L 29/0653* (2013.01); *H01L 29/0895* (2013.01); *H01L 29/66742* (2013.01); *H01L 29/78609* (2013.01); *H01L 29/78618* (2013.01); *H01L 29/78642* (2013.01); *H01L 29/78681* (2013.01); *H01L 29/78696* (2013.01)

(58) Field of Classification Search
CPC ................... H01L 29/66977; H01L 29/0895
See application file for complete search history.

(56) References Cited

U.S. PATENT DOCUMENTS

| | | |
|---|---|---|
| 6,909,141 B2 | 6/2005 | Rösner et al. |
| 7,943,973 B2 | 5/2011 | Kakoschke et al. |
| 2006/0121700 A1 | 6/2006 | Peng et al. |
| 2011/0215425 A1 | 9/2011 | Loh et al. |

(Continued)

OTHER PUBLICATIONS

"Power-Efficient, Low Leakage, Vertical Mode Tunneling Field-Effect-Transistor (TFETs) with III-V Tunneling Junctions and Lateral Oxidation in Controlling the Tunneling Region," accessed at https://www.ibridgenetwork.org/#!/profiles/3005753024297/innovations/158, pp. 1-2 (Jul. 2011).

(Continued)

*Primary Examiner* — Matthew E Warren

(57) ABSTRACT

A vertical-mode tunnel field-effect transistor (TFET) is provided with an oxide region that may be laterally positioned relative to a source region. The oxide region operates to reduce a tunneling effect in a tunnel region underlying a drain region, during an OFF-state of the TFET. The reduction in tunneling effect results in a reduction or elimination of a flow of OFF-state leakage current between the source region and the drain region. The TFET may have components made from group III-V compound materials.

23 Claims, 8 Drawing Sheets

(56) References Cited

U.S. PATENT DOCUMENTS

| | | |
|---|---|---|
| 2012/0032227 A1 | 2/2012 | Seabaugh et al. |
| 2012/0228706 A1 | 9/2012 | Sugizaki et al. |
| 2013/0093497 A1 | 4/2013 | Lee et al. |
| 2014/0061777 A1 | 3/2014 | Kanemura |
| 2014/0252455 A1 | 9/2014 | Chuang et al. |
| 2014/0264277 A1 | 9/2014 | Doornbos et al. |
| 2014/0288898 A1 | 9/2014 | Fukuda |

OTHER PUBLICATIONS

"Breaking the performance barrier of 22-nm CMOS technology: Are high-mobility, non-silicon channel materials the answer?," accessed at http://web.archive.org/web/20110930024857/http://www.zurich.ibm.com/news/08/duallogic.html, Feb. 19, 2008, pp. 2.

Cheng, J., and Dutta, N.K., "Vertical-cavity surface-emitting lasers: technology and applications," in Optoelectronic properties of semiconductors and superlattices, vol. 10, CRC Press, pp. 3-15 (Jul. 6, 2000).

Dallesasse, J. M., et al., "Hydrolyzation oxidation of $Al_xGa_{1-x}As$—AlAs—GaAs quantum well heterostructures and superlattices," Applied Physiscs Letters, vol. 57, Issue 26, pp. 2844-2846 (Jan. 1990).

Datta, S., "Compound Semiconductor as CMOS Channel Material: DéjÀ vu or New Paradigm?," IEEE Device Research Conference, pp. 33-36 (Jun. 23-25, 2008).

Fukada, H., et al., "Fabrication of Silicon Nanopillars Containing Polycrystalline Silicon/Insulator Multilayer Structures," Applied Physics Letters, vol. 70, Issue 3, pp. 333-335 (Feb. 1997).

Gebretsadik, H., et al., "Lateral oxidation of InAlAs in InP-based heterostructures for long wavelength vertical cavity surface emitting laser applications," Applied Physics Letters, vol. 72, No. 2, pp. 135-137 (Nov. 7, 1997).

Mayer, F., et al., "Impact of SOI, $Si_{1-x}Ge_xOI$ and GeOI substrates on CMOS compatible Tunnel FET performance," IEEE International Electron Device Meeting, pp. 1-5 (Dec. 15-17, 2008).

Mookerjea, S., et al., "Experimental demonstration of 100nm channel length $In_{0.53}Ga_{0.47}As$-based vertical inter-band tunnel field effect transistors (TFETs) for ultra low-power logic and SRAM applications," IEEE International Electron Device Meeting, pp. 949-951 (Dec. 7-9, 2009).

Roy, K., et al., "Leakage Current Mechanisms and Leakage Reduction Techniques in Deep-Submicrometer CMOS Circuits," Proceedings of the IEEE, vol. 91, No. 2, pp. 305-327 (Apr. 29, 2003).

Toh E-H., et al., "Device physics and guiding principles for the design of double-gate tunneling field effect transistor with silicon-germanium source heterojunction," Applied Physics Letters, vol. 91, Issue 24, pp. 1-3 (Dec. 2007).

Zhang, Q., et al., "Low-Subthreshold-Swing Tunnel Transistors," IEEE Electron Device Letters, vol. 27, No. 4, pp. 297-300 (Apr. 2006).

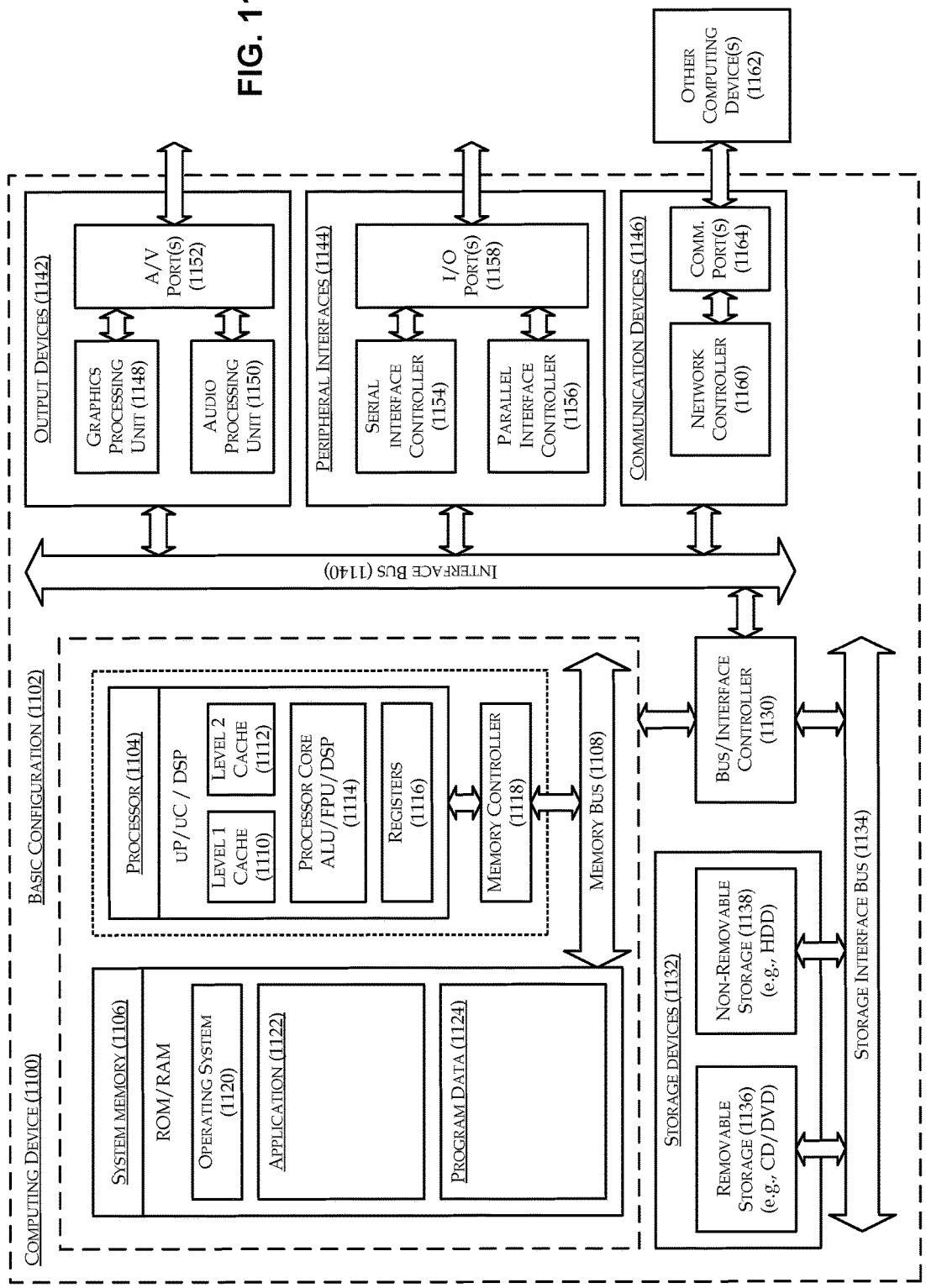

TUNNEL FIELD-EFFECT TRANSISTOR (TFET) WITH LATERAL OXIDATION

CROSS-REFERENCE TO RELATED APPLICATIONS

The present application is a continuation under 35 U.S.C. § 120 of U.S. patent application Ser. No. 15/006,818, filed on Jan. 26, 2016, now U.S. Pat. No. 9,853,135, which in turn is a continuation under 35 U.S.C. § 120 of U.S. patent application Ser. No. 13/274,001, filed on Oct. 14, 2011, now U.S. Pat. No. 9,293,591. U.S. patent application Ser. No. 15/006,818 and U.S. patent application Ser. No. 13/274,001 are incorporated herein by reference in their entireties.

STATEMENT REGARDING GOVERNMENT SPONSORED RESEARCH OR DEVELOPMENT

The work described herein was sponsored at least in part by the Emerging Technology Fund of Texas, Project "UT Dallas Sub: High-K III-V MOSFETs," grant no. UTD 09-10. The state of Texas may have certain rights to the subject matter disclosed herein.

BACKGROUND

As metal-oxide-semiconductor transistors (MOSFETs) are aggressively scaled to smaller size, the performance of such MOSFETs may be significantly limited by short channel effects and gate leakage current. Short channel effects arise if channel lengths of MOSFETs are reduced by scaling in an attempt to increase both operational speed and a number of MOSFETs per chip. Threshold voltages of MOSFETs become more difficult to control, due at least in part to a modification of the threshold voltage caused by the shortening of the channel lengths as a result of scaling. With regards to gate leakage current, scaling reduces a thickness of a gate oxide of a MOSFET, but the decreased thickness of the gate oxide causes an amount of the gate leakage current to increase during an OFF-state of the MOSFET. The increased amount of gate leakage current disadvantageously results in increased power consumption.

In addition to short channel effects and increased gate leakage current, there are other challenges with MOSFETs. As one example, MOSFETs have a high subthreshold swing, typically greater than 60 mV/decade. The subthreshold swing is generally defined as a level of gate voltage to change a drain current by one order of magnitude (e.g., by one decade), and with scaling to reduce a MOSFET's size, the subthreshold swing increases. A disadvantageous consequence of an increased subthreshold swing is that a higher power supply voltage may be needed to turn ON the MOSFET. Another disadvantage of an increased subthreshold swing is an increase in leakage current during an OFF-state of the MOSFET. Supply voltage scaling is another example of a challenge with MOSFETs. It is often difficult to scale (decrease or increase) a level of supply voltage (e.g., $V_{DD}$) provided to a MOSFET based on the particular application or use of the MOSFET. Thus, $V_{DD}$ scaling limitations may reduce the capability to provide an optimum supply voltage $V_{DD}$ to a reduced-size MOSFET for a low-power digital application.

In comparison to MOSFETs, tunneling field-effect transistors (TFETs) having a gate-modulated Zener tunnel region may provide subthreshold swings of less than 60 mV/decade and may operate at a lower supply voltage $V_{DD}$. Thus, TFETs are considered as potential candidates to replace MOSFETs in low-power digital applications.

However, most silicon (Si)-based or silicon-germanium (SiGe)-based TFETs exhibit low ON-state current. For example, there is a high tunneling barrier in the tunnel region of Si-based and SiGe-based TFETs, due at least in part to the large bandgap of the material of the tunnel region. This high tunneling barrier is characterized by a smaller amount of electrons moving through the tunnel region, thereby resulting in reduced ON-state current that in turn results in slower operating speed of the Si-based and SiGe-based TFETs.

BRIEF DESCRIPTION OF THE DRAWINGS

Subject matter is particularly pointed out and distinctly claimed in the concluding portion of the specification. The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

The sizes and relative positions of elements in the drawings are not necessarily drawn to scale. For example, the shapes of various elements and angles may not be drawn to scale, and some of these elements and angles may be arbitrarily enlarged and positioned to improve drawing legibility. Further, the particular shapes of the components as drawn, are not intended to convey any information regarding the actual shape of the particular component, and have been solely selected for ease of recognition in the drawings.

Various embodiments will be described referencing the accompanying drawings in which like references denote similar elements, and in which:

FIG. 1 is a diagrammatic sectional view of a tunnel field-effect transistor (TFET), in accordance with various embodiments;

FIG. 2 is a diagrammatic top view of the TFET of FIG. 1, in accordance with various embodiments;

FIG. 3 is a flowchart of a method to manufacture the TFET of FIG. 1, in accordance with various embodiments;

FIG. 4 is a diagrammatic sectional view of a structure formed using a first step of the method of FIG. 3, in accordance with various embodiments;

FIG. 5 is a diagrammatic sectional view of a structure formed using a second step of the method of FIG. 3, in accordance with various embodiments;

FIG. 6 is a diagrammatic sectional view of a structure formed using a third step of the method of FIG. 3, in accordance with various embodiments;

FIG. 7 is a diagrammatic sectional view of a structure formed using a fourth step of the method of FIG. 3, in accordance with various embodiments;

FIG. 8 is a diagrammatic sectional view of a structure formed using a fifth step of the method of FIG. 3, in accordance with various embodiments;

FIG. 9 is a diagrammatic sectional view of a structure formed using a sixth step of the method of FIG. 3, in accordance with various embodiments;

FIG. 10 is a flowchart of a method of operating the TFET 100 of FIG. 1, in accordance with various embodiments; and FIG. 11 is an example computing device suitable for practicing various embodiments.

DETAILED DESCRIPTION

Figure 1:
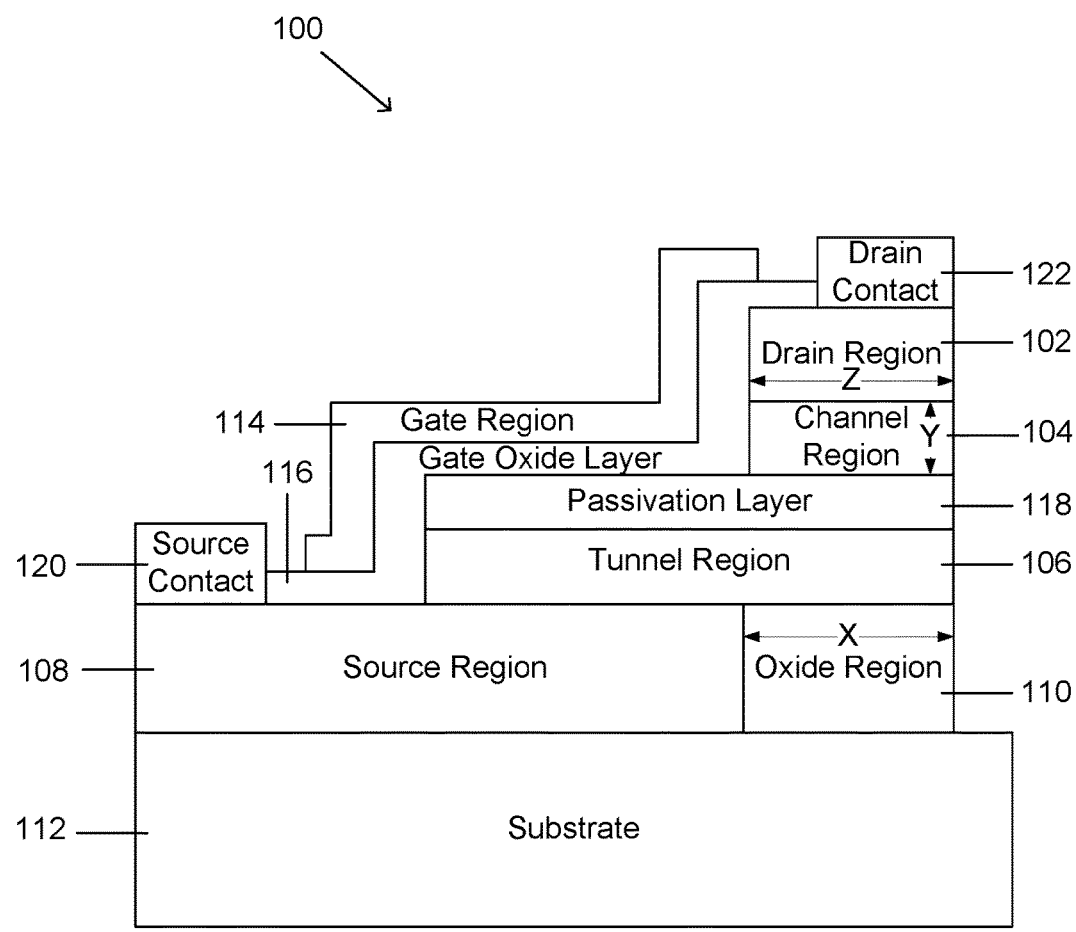

The following description sets forth various examples along with specific details to provide a thorough understanding of claimed subject matter. It will be understood, however, the claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

With respect to the use of substantially any plural and/or singular terms herein, it is possible to translate from the plural to the singular and/or from the singular to the plural as is appropriate to the context and/or application. The various singular/plural permutations may be expressly set forth herein for sake of clarity.

This disclosure is drawn, inter alia, to a structural arrangement of a tunnel field-effect transistor (TFET) having lateral oxidation to control tunneling effect in a tunnel region of the TFET, a method of operating such a TFET, and a method of manufacturing such a TFET.

As an overview, the TFET of some embodiments has lateral oxidation that operates to reduce OFF-state leakage current flow of the TFET. Furthermore, at least some components of the TFET of some embodiments are made from group III-V compound materials, which have physical properties that enable an increased level of ON-state current through the tunnel region of the TFET. By having the lateral oxidation and the components made from group III-V materials, the TFET of some embodiment also addresses at least some of the disadvantages of MOSFETs and Si-based and SiGe-based TFETs described above. In various embodiments, the TFET may have a vertical arrangement of some of its components.

FIG. 1 is a diagrammatic sectional view of a TFET 100, in accordance with various embodiments of the present disclosure. In some embodiments, components of the TFET 100 may comprise a drain region 102, a channel region 104, a tunnel region 106, a source region 108, an oxide region 110, and a substrate 112. Furthermore, the TFET 100 of some embodiments may further comprise a gate region 114, a gate oxide layer 116, and a passivation layer 118.

The TFET 100 of some embodiments may have a generally "vertical" arrangement (referred to herein as "vertical-mode") of at least some of its components. For example, the source region 108, the channel region 104, and the drain region 102 may be vertically stacked over the substrate 112 in some embodiments.

In some embodiments of the TFET 100, the channel region 104 may be coupled to the drain region 102, and may for example vertically underlie the drain region 102 in some embodiments of a vertical-mode TFET, such as shown by way of example in FIG. 1. The tunnel region 106 of some embodiments may have a portion, with a width generally corresponding to a width X of the oxide region, coupled to the channel region 104 and to the drain region 102. The portion (of the tunnel region 106) having a width generally corresponding to the width X may, for example, vertically underlie the drain region 102 and the channel region 104 in some embodiments of a vertical-mode TFET, such as shown by way of example in FIG. 1. The tunnel region 106 may be further coupled to the source region 108.

In some embodiments, the oxide region 110 may be positioned at least partially under the drain region 102, the channel region 104, and the portion of the tunnel region 106 underlying the drain region 102, and may further be positioned laterally relative to the source region 108. The purpose(s) for positioning the oxide region 110 at these locations will be explained in detail below.

In some embodiments of the TFET 100, for example in a vertical-mode TFET, the gate region 114 may vertically overlie at least some of the source region 108 and at least some of the tunnel region 106. Furthermore, in some embodiments such as shown by way of example in FIG. 1, the gate region 114 may be laterally displaced relative to the drain region 102, so that the gate region 114 may not vertically overlie all or most portions of the drain region 102. The gate oxide layer 116 of some embodiments may be positioned between the gate region 114 and any one or more of the source region 108, the tunnel region 106, the passivation layer 118, the channel region 104, and the drain region 102.

The passivation layer 118 of some embodiments may be positioned between the channel region 104 and the tunnel region 106, and may operate to provide an improved physical interface or improved coupling with the gate oxide layer 116. The passivation layer 118 may be made of indium phosphide (InP), for example, or other suitable materials that would be familiar to those skilled in the art having the benefit of this disclosure.

The TFET 100 of some embodiments may further comprise a source contact 120 coupled to the source region 108, and a drain contact 122 coupled to the drain region 102. A supply voltage $V_{DD}$ (not shown) may be applied to the drain region 102 by way of the drain contact 122. In some embodiments, a supply voltage $V_G$ (not shown) may be applied to the gate region 114. In some embodiments, a supply voltage $V_{SS}$ (not shown) may be applied to the source region 108 by way of the source contact 120.

According to some embodiments, the source contact 120 and the drain contact 122 may be made from a suitably conductive metal, such as a gold germanium/nickel/gold (AuGe/Ni/Au) contact. The gate region 114 may be made from a metal, such as tantalum nitride (TaN) as an example or from some other suitable material that would be familiar to those skilled in the art having the benefit of this disclosure. For instance, additional possible materials that may be used for the source contact 120, the drain contact 122, and/or the gate region 114 may include, but not be limited to, tungsten, copper, gold, silver, tin, highly doped silicon, aluminum (Al), or other materials or combination thereof. The gate oxide, if present in some embodiments, may be made, for example, from silicon dioxide ($SiO_2$), aluminum oxide ($Al_2O_3$), or other suitable oxide material that would be familiar to those skilled in the art having the benefit of this disclosure.

According to some embodiments, at least some of the components of the TFET 100 may be made from a group III-V compound material. For example, at least one of the drain region 102, the channel region 104, the passivation layer 118, the tunnel region 106, the source region 108, or the substrate 112 may be made from a group III-V compound material in some embodiments. In some embodiments, the oxide region 110 may be made from a group III-V compound material that has been oxidized, as will be described in detail below. In some embodiments, the substrate 112 may be made from some other material, such as silicon (Si), instead of a group III-V compound material.

Examples of group III-V compound materials that can be used for the drain region 102, the channel region 104, the passivation layer 118, the tunnel region 106, the source region 108, the substrate 112, or the oxide region 110 (prior to oxidation) include but are not limited to: aluminium antimonide (AlSb), aluminium arsenide (AlAs), aluminium nitride (AlN), aluminium phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminium gallium arsenide (AlGaAs), indium gallium arsenide (InGaAs), indium gallium phosphide (InGaP), aluminium indium arsenide (AlInAs), aluminium indium antimonide (AlInSb), gallium arsenide nitride (GaAsN), gallium arsenide phosphide (GaAsP), aluminium gallium nitride (AlGaN), aluminium gallium phosphide (AlGaP), indium gallium nitride (InGaN), indium arsenide antimonide (InAsSb), indium gallium antimonide (InGaSb), aluminium gallium indium phosphide (AlGaInP), aluminium gallium arsenide phosphide (AlGaAsP), indium gallium arsenide phosphide (InGaAsP), aluminium indium arsenide phosphide (AlInAsP), aluminium gallium arsenide nitride (AlGaAsN), indium gallium arsenide nitride (InGaAsN), indium aluminium arsenide nitride (InAlAsN), gallium arsenide antimonide nitride (GaAsSbN), gallium indium nitride arsenide antimonide (GaInNAsSb), or gallium indium arsenide antimonide phosphide (GaInAsSbP).

In some embodiments, a combination of group III-V compound materials that may be used for the TFET 100 are indium gallium arsenide (InGaAs) for the tunnel region 106 and aluminum gallium arsenide (AlGaAs) or aluminium indium arsenide (AlInAs) for the drain region 102, the source region 108, or the channel region 104. In some embodiments, the oxide region 110 may be made from the same or substantially similar group III-V material as the source region 108, such as AlGaAs that has been oxidized to form aluminum oxide (AlO$_2$).

The group III-V compound materials and/or other materials that make up the components of some embodiments of the TFET 100 may in turn be doped with a dopant (such as by using an ion implantation technique) so as to have certain doping concentrations, thereby providing the appropriate electrical/transistor functionality for the TFET 100. For instance in some embodiments, the drain region 102 may be made from a heavily doped group III-V compound material of a first conductivity type (for example, to provide an n-type drain region 102); the channel region 104 may be made from a lightly doped group III-V compound material of the first conductivity type; the passivation layer 118 may be made from a compound material of the first conductivity type; the tunnel region 106 may be made from another heavily doped group III-V compound material of the first conductivity type; and the source region 108 may be made from a heavily doped group III-V compound material of a second conductivity type different from the first conductivity type (for example, to provide a p-type source region 108). In some embodiments of the TFET 100 that provide a group III-V compound material for the substrate 112, the substrate 112 may be made from a semi-insulating (SI) material or a heavily doped group III-V compound material of the second conductivity type.

The concentration and type of dopant used in order to provide a "heavily doped" (n+ or p+) material or a "lightly doped" (n− or p−) material would be familiar to those skilled in the art having the benefit of this disclosure. In some embodiments according to the above-described doping, the drain region 102 may be n+ AlGaAs; the channel region 104 may be n− AlGaAs; the tunnel region 106 may be n+ InGaAs; and the source region 108 may be p+ AlGaAs.

In comparison to Si-based or SiGe-based TFETs previously discussed, embodiments of the TFET 100 using group III-V compound materials may enable higher ON-state current. For example, the group III-V compound material of the tunnel region 106 provides lower tunneling barrier due to a smaller bandgap, as compared to the tunnel region of Si-based or SiGe-based TFETs that have larger bandgaps and therefore have more prominent resistive or insulating effects through their tunnel regions. The smaller bandgap and a smaller effective electron mass of group III-V compound materials result in increased conductivity (characterized by faster movement of electrons) through the tunnel region 106 and hence the ON-state current for some embodiments of the TFET 100 may be increased. The increased ON-state current thus enables some embodiments of the TFET 100 to have faster operating speeds.

The TFET 100 of some embodiments addresses a drawback of some conventional transistors that have significant leakage current during an OFF-state of such transistors. For example with conventional TFETs, the direction of flow of the OFF-state leakage current is between a source region and a drain region and is outside the gate control, and through a tunnel region and a channel region. A tunneling effect of the tunnel region undesirably enables substantive OFF-state leakage current to more easily flow between the source region and the drain region through the channel region during an OFF-state of the conventional TFETs. To reduce this substantive OFF-state leakage current, conventional TFETs are made with a longer/thicker channel region. The longer/thicker channel region negates the effect of the drain voltage alone that would otherwise facilitate OFF-state leakage current flow, since the drain voltage has to drop across the longer/thicker channel region, and reduces the tunneling current in the region outside the gate control. However, such longer/thicker channel regions also result in a reduction of ON-state current, due to longer effective channel length and higher channel resistance. Thus, the length/thickness of channel regions may not be aggressively scaled down in conventional TFETs or else OFF-state leakage current may become more prominent.

Accordingly, the TFET 100 of various embodiments provides the oxide region 110 such as shown by way of example in FIG. 1. The oxide region 110 of some embodiments, such as in a vertical-mode TFET configuration described above and shown in FIG. 1, is positioned so as to operate as an insulator to block or otherwise reduce OFF-state leakage current that may flow in a direction between the source region 108 and the drain region 102 through the channel region 104 and the tunnel region 106 and outside the gate control. In some embodiments, for example, the oxide region 110 is positioned at least partially under the drain region 102. This position of the oxide region 110 reduces or eliminates the capability of the OFF-state leakage current to use the tunneling (which would otherwise be provided under the drain region 102 by the portion of the tunnel region 106 spanning the width X) for a current path.

In some embodiments, such as in a vertical-mode TFET 100 shown in FIG. 1, electrical fields from the drain region 102 emanate in a generally downward direction across the channel region 104. Any potential OFF-state leakage current may flow along a current path that follows such electrical fields. Accordingly, the width X of the oxide region 110 may be suitably designed to block or otherwise restrict the current path (of the potential OFF-state leakage current) that follows the generally downward direction of the electrical fields from the drain region 102.

Furthermore in some embodiments, the presence of the oxide region 110 may enable a length/thickness Y of the channel region 104 to be reduced. For instance, the insulating effect of the oxide region 110 reduces or eliminates a need for a longer length/thickness of the channel region 104 that would otherwise have been used to reduce OFF-state leakage current flow. Hence, the length/thickness Y of the channel region 104 of some embodiments of the TFET 100 may be scaled down. As an example for some embodiments, the length/thickness Y of the channel region 104 may be reduced from approximately 5 nm-100 nm, to approximately 1 nm-50 nm. This reduced thickness/length Y of the channel region 104 enables ON-state current of the TFET 100 to be increased, thereby resulting in faster operational speed. The capability to provide (a) increased or higher ON-state current, (b) a subthreshold swing of less than 60 mV/decade, (c) a reduced OFF-state leakage current, and/or (d) a smaller size thus enables a TFET 100 (having components made from group III-V compound materials) of some embodiments to be well-suited for low-power, low-operating-voltage digital applications.

In some embodiments, the width X of the oxide region 110 may be approximately equal to a width Z of the drain region 102 so as to underlie substantially an entirety of the drain region 102, and may be greater or lesser than the width Z by some nominal amount. In some embodiments, the width X of the oxide region 110 may differ from (e.g., may be greater than or less than) the width Z of the drain region 102 by approximately 3% to 30%. The amount of a difference, if any, between the width X and the width Z may be influenced by a variety of factors related to an operationally acceptable performance level of some embodiments of the TFET 100. For example, in some implementations, a higher level of OFF-state leakage current may be operationally acceptable and/or a longer length/thickness Y of the channel region 104 may be operationally acceptable, and so the width X of the oxide region 110 may be designed to be substantially less than the width Z of the drain region 102. As another example, a particular low level of OFF-state leakage current and/or a particular level of ON-state current may be desired for a certain application, and so the width X of the oxide region 110 alone or in combination with the length/thickness Y of the channel region 104 may be chosen so as to achieve the particular low level of OFF-state leakage current and/or the particular level of ON-state current.

Figure 2:
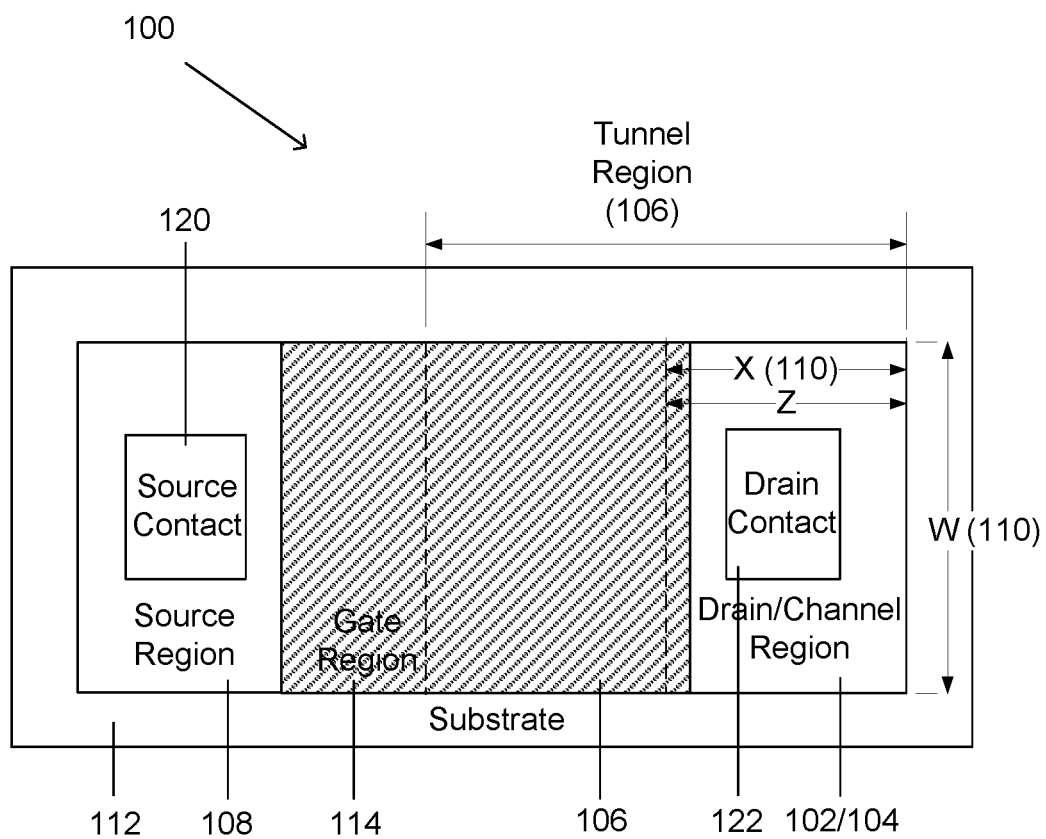

FIG. 2 is a diagrammatic top view of the TFET 100 of FIG. 1, in accordance with various embodiments. The gate region 114 is shown in the shaded area, and at least a portion of the tunnel region 106 may underlie the gate region 114 and the extent (shown in by a broken line) in which the tunnel region 106 may underlie the gate region may be defined by an etching process, described later below. The channel region 104 may underlie the drain region 102, such that the footprint of the drain region 102 may be approximately the same as the footprint of the channel region 104.

With respect to the oxide region 110, FIG. 2 illustrates an embodiment wherein the width X of the oxide region 110 may be approximately equal to the width Z of the drain region 102. Furthermore, FIG. 2 illustrates an embodiment wherein a dimension W (such as a depth) of the oxide region 110 may be approximately equal to the depth of the drain region 102. Thus, in the embodiment illustrated in FIG. 2, the oxide region 110 may have substantially the same footprint as the drain region 102 and/or the channel region 104.

Figure 3:
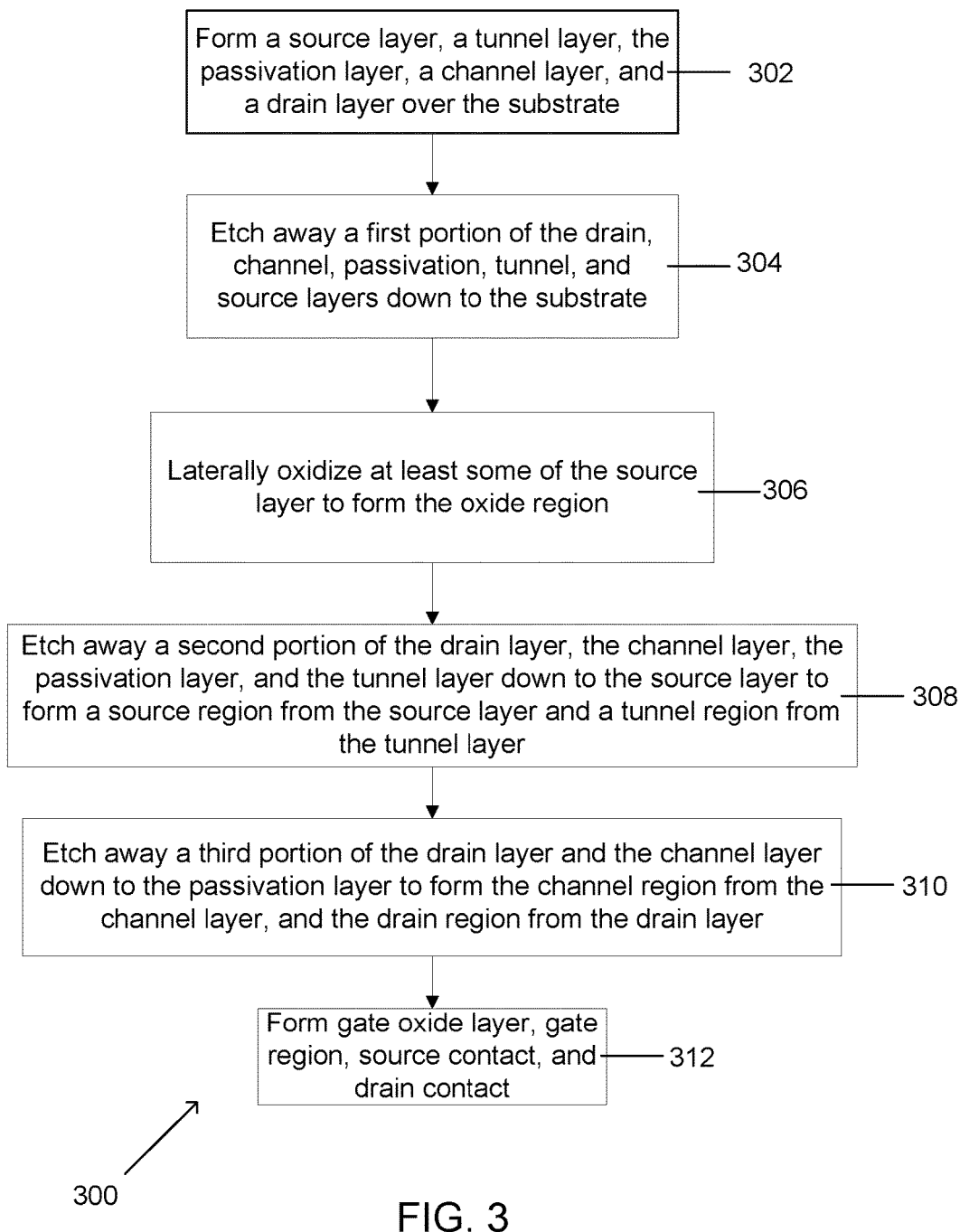

FIG. 3 is a flowchart of a method 300 to manufacture the TFET 100 of FIG. 1, in accordance with various embodiments. FIGS. 4-9 are diagrammatic sectional views of a structure that is obtained after each step of the method 300 to manufacture the TFET of FIG. 1, in accordance with various embodiments. It is understood that various elements of the depicted method 300 may not necessarily be performed in the exact order that is shown. Moreover, certain elements of the method 300 may be added, removed, or modified in some embodiments.

Figure 4:
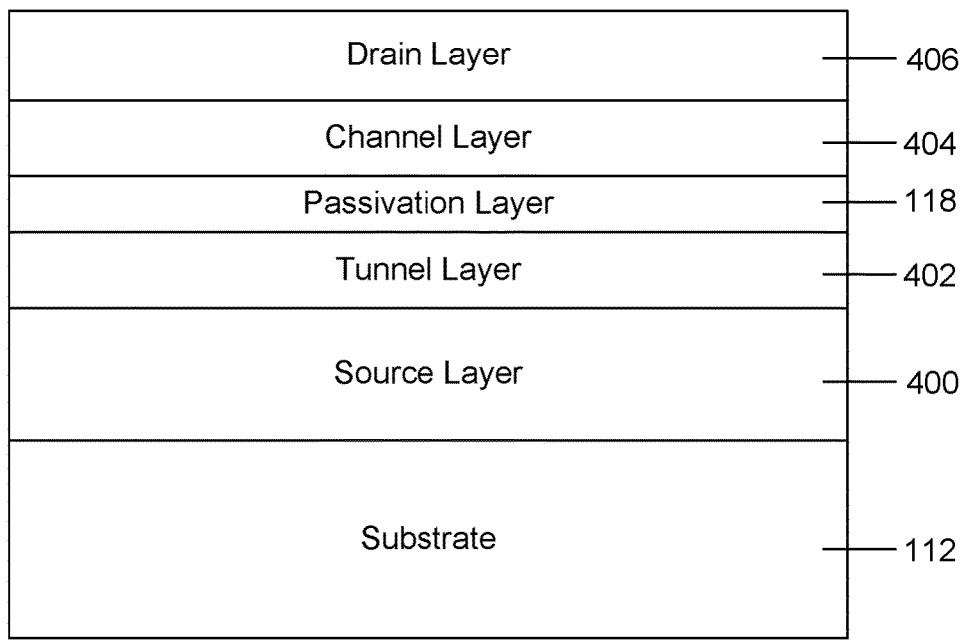

FIG. 4 is a diagrammatic sectional view of a structure formed using a first step 302 of the method 300 of FIG. 3, in accordance with various embodiments. In the first step 302 in FIG. 3 and also as shown by the resulting structure in FIG. 4, a source layer 400, a tunnel layer 402, the passivation layer 118, a channel layer 404, and a drain layer 406 may be formed over the substrate 112. In some embodiments, molecular beam epitaxy (MBE) may be used to form these layers on the substrate 112, including using MBE to epitaxially grow at least some of these layers using group III-V compound materials.

Figure 5:
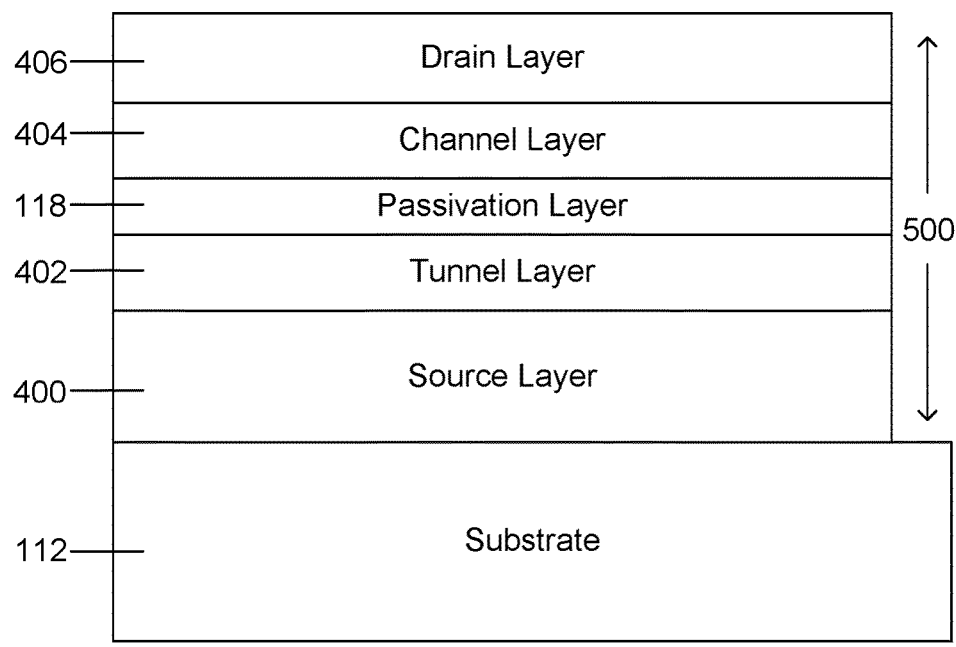

FIG. 5 is a diagrammatic sectional view of a structure formed using a second step 304 of the method 300 of FIG. 3, in accordance with various embodiments. In the second step 304 in FIG. 3 and also as shown by the resulting structure in FIG. 5, different kinds of etching techniques may be used to etch away a first portion 500 of the drain layer 406, the channel layer 404, the passivation layer 118, the tunnel layer 402, and the source layer 400 down to the substrate 112. In some embodiment, a mesa etching technique, an anisotropic etching technique, or other directional etching technique may be used. In some embodiments, a wet etching technique, an isotropic etching technique, or other technique may be used to remove the first portion 500.

Figure 6:
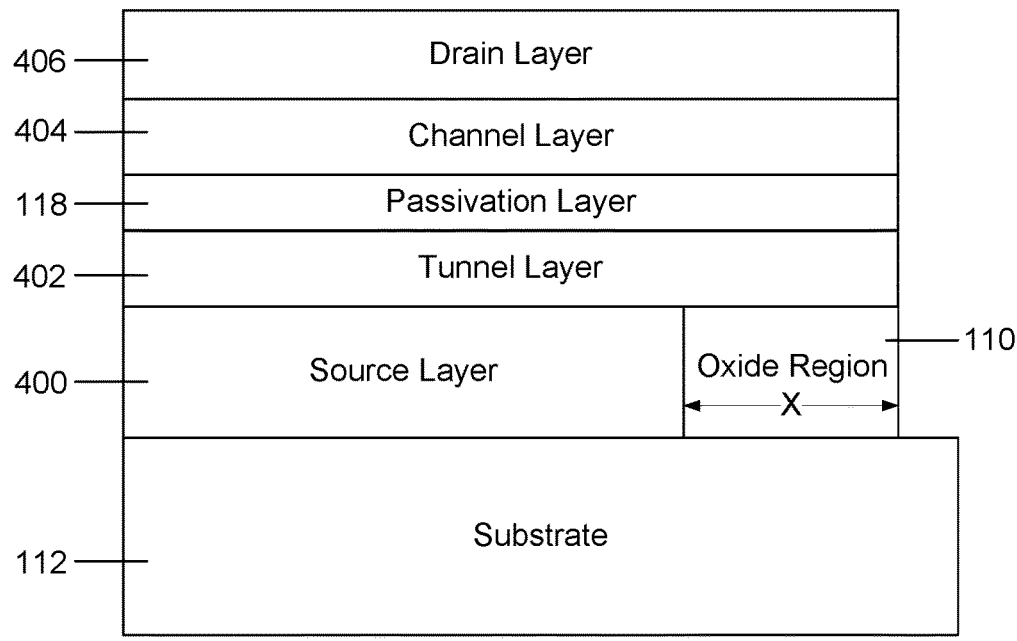

FIG. 6 is a diagrammatic sectional view of a structure formed using a third step 306 of the method of FIG. 3, in accordance with various embodiments. In the third step 306 in FIG. 3 and also as shown by the resulting structure in FIG. 6, the oxide region 110 may be formed by laterally oxidizing the same starting material as the source layer 400. For example in some embodiments, lateral oxidation may be performed on at least some portion of the source layer 400 that is positioned next to the first portion 500 that was etched away in FIG. 5.

In some embodiments, the lateral oxidation of FIG. 6 may be performed using thermal oxidation (or other wet oxidation process), in which the material of the source layer 400 (such as a group III-V compound material) reacts with water vapor, carried by nitrogen gas, so as to form an oxide. In some embodiments, the time and/or temperature to perform the lateral oxidation may be based at least in part on factors such as the type of material being oxidized, a desired width X of the oxide region 110, or other considerations. As an example, for some embodiments that use AlGaAs as the group III-V material for the source layer 400, the lateral oxidation may be performed at approximately 400 degrees Celsius. Other temperatures are possible, such as approximately 425 degrees Celsius, approximately 450 degrees Celsius, or other temperatures. In some embodiments, lateral oxidation of the source layer 400 may exhibit a generally linear oxidation rate at one or more of these temperatures. For instance, at approximately 400 degrees Celsius for AlGaAs material that is approximately 80 nm thick: approximately 100 minutes of lateral oxidation may be used to obtain a width X=approximately 15 microns, approximately 200 minutes of lateral oxidation may be used to obtain a width X=approximately 25 microns, approximately 300 minutes of lateral oxidation may be used to obtain a width X=approximately 35 microns, and so forth.

Figure 7:
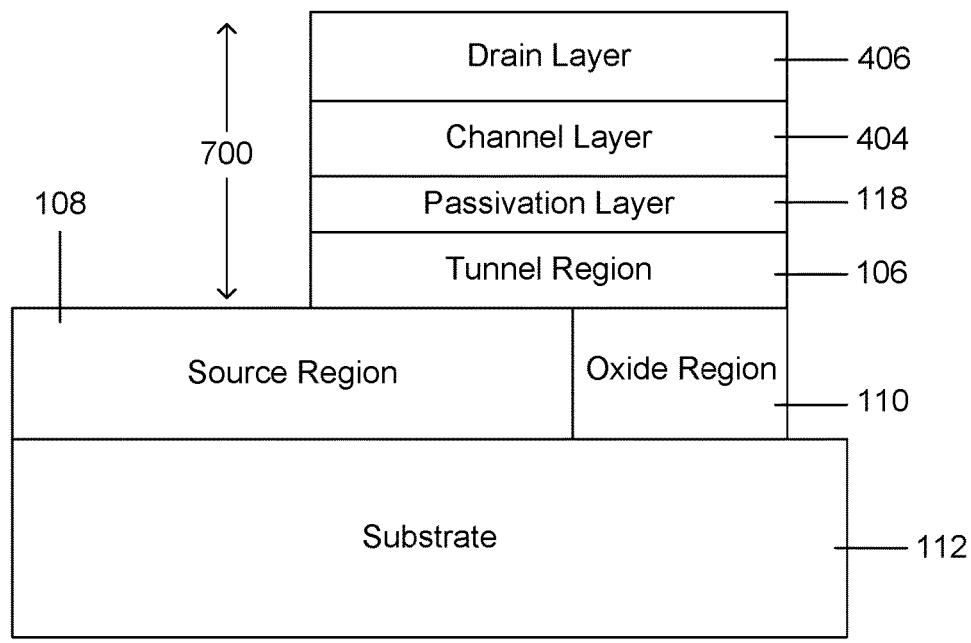

In a fourth step 308 in FIG. 3, an etching process may be used to etch away a second portion of the drain layer 406, the channel layer 404, the passivation layer 118, and the tunnel layer 402 down to the source layer 400. FIG. 7 is a diagrammatic sectional view of a structure formed using the fourth step 308 of the method 300 of FIG. 3, in accordance with various embodiments. In FIG. 7, the etching process of the fourth step 308 of FIG. 3 has removed the second portion (shown at 700) so as to form the source region 108 from the source layer 400 of FIG. 6 and the tunnel region 106 from the tunnel layer 402 of FIG. 6. In some embodiment, a mesa etching technique, an anisotropic etching technique, or other directional etching technique may be used. In some embodiments, a wet etching technique, an isotropic etching technique, or other technique may be used to remove the second portion 700.

Figure 8:
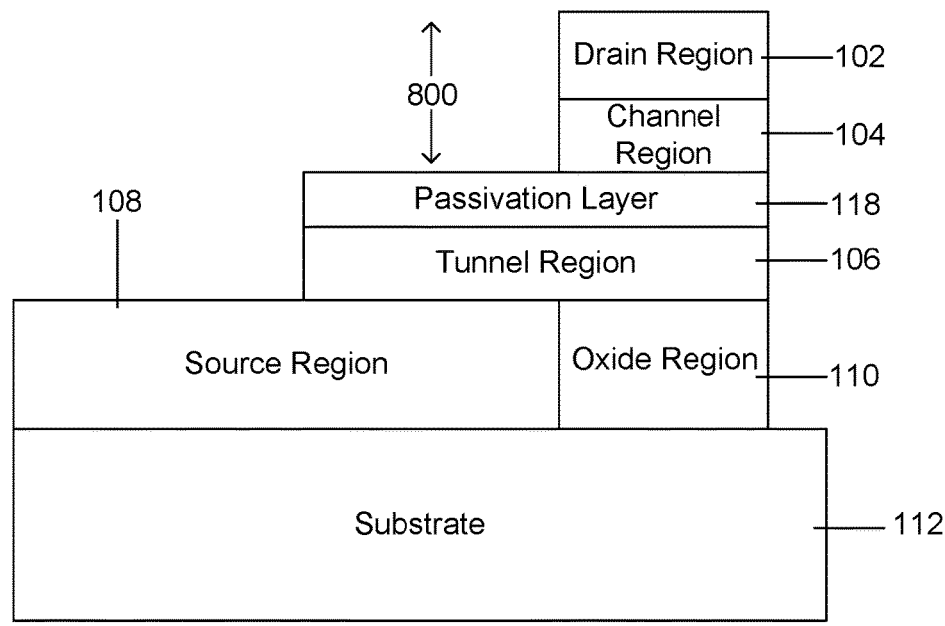

In a fifth step 310 in FIG. 3, an etching process may be used to etch away a third portion of the drain layer 406 and the channel layer 404. FIG. 8 is a diagrammatic sectional view of a structure formed using a fifth step 310 of the method 300 of FIG. 3, in accordance with various embodiments. In FIG. 8, the etching process of the fifth step 310 of FIG. 3 has removed the third portion (shown at 800) down to the passivation layer 118, so as to form the channel region 104 from the channel layer 404 shown in FIG. 7 and the drain region 102 from the drain layer 406 shown in FIG. 7. As with the other etchings described above, a mesa etching technique, an anisotropic etching technique, or other directional etching technique may be used in some embodiments. In some embodiments, a wet etching technique, an isotropic etching technique, or other technique may be used to remove the third portion 800.

Figure 9:
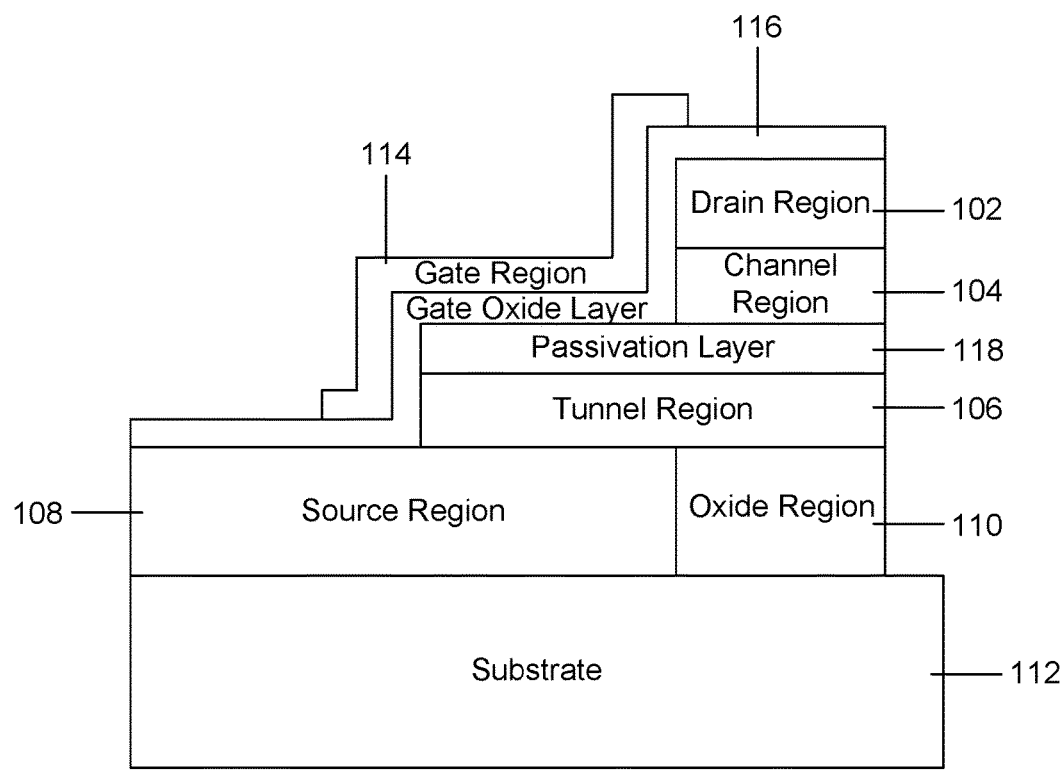

At a sixth step 312 of the method 300 of FIG. 3, the gate oxide layer 116, the gate region 114, the source contact 120, and the drain contact 122 may be formed. FIG. 9 (and also FIG. 1) is a diagrammatic sectional view of a structure formed using a sixth step 312 of the method 300 of FIG. 3, in accordance with various embodiments. In FIG. 9, the gate oxide layer 116 is formed that may overlie or otherwise at least partially covers the source region 108, the tunnel region 106, the passivation layer 118, the channel region 104, and the drain region 102 in some embodiments. Also in FIG. 9, the gate region 114 may be formed over the gate oxide layer 116, and in some embodiments, may horizontally overlap at least some of the tunnel region 106 and the channel region 104. Standard techniques may be used in some embodiments to form the gate oxide layer 116 and the gate region 114.

At least some of the gate oxide layer 116 that overlies the source region 108 and the drain region 102 may then be removed, so that the source contact 120 can be formed over the source region 108 and the drain contact 122 can be formed over the drain region 102, such as shown in a completed TFET 100 of FIG. 1.

Figure 10:
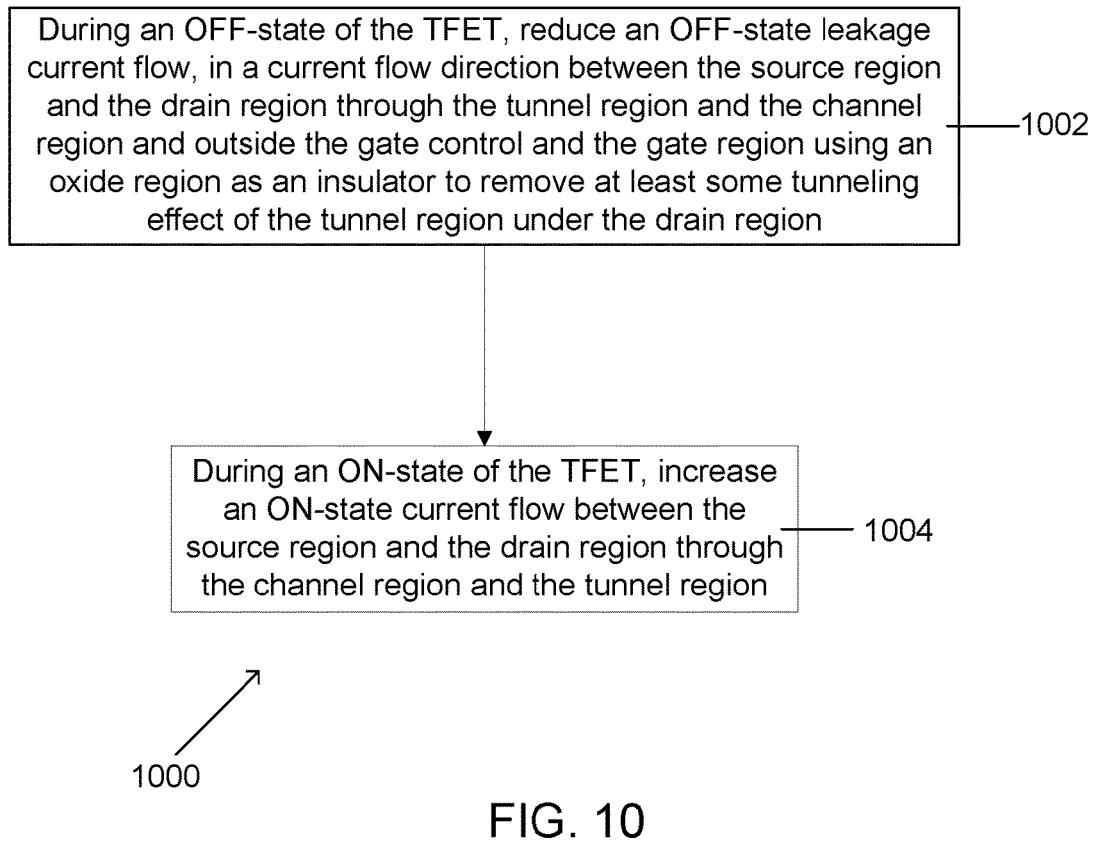

FIG. 10 is a flowchart of a method 1000 of operating the TFET 100 of FIG. 1, in accordance with various embodiments. At 1002, such as during an OFF-state of the TFET 100, an OFF-state leakage current flow (in a current flow direction between the source region 108 and the drain region 102 through the tunnel region 106 and the channel region 104 and outside the gate control and the gate region 114) may be reduced using the oxide region 110 as an insulator to remove at least some tunneling effect of the tunnel region 106 under the drain region 102.

At 1004, such as during an ON-state of the TFET 100, an ON-state current flow (between the source region 108 and the drain region 102 through the channel region 104 and the tunnel region 106) may be increased. According to various embodiments, the increased ON-state current flow may be enabled by a decreased thickness of the channel region 104 due to the oxide region 110 being used to reduce the OFF-state current flow.

FIG. 11 is a block diagram illustrating an example of a computing device 1100 that is arranged for performing the method 1000 of FIG. 10 to operate the TFET 100 in accordance with the present disclosure. For example, the computing device 1100 may include one or more components that utilize/operate an embodiment of the TFET 100. In a very basic configuration 1102, computing device 1100 typically includes one or more processors 1104 and a system memory 1106. A memory bus 1108 may be used for communicating between processor 1104 and system memory 1106.

Depending on the desired configuration, processor 1104 may be of any type including but not limited to a microprocessor (μP), a microcontroller (μC), a digital signal processor (DSP), or any combination thereof. Processor 1104 may include one or more levels of caching, such as a level one cache 1110 and a level two cache 1112, a processor core 1114, and registers 1116. An example processor core 1114 may include an arithmetic logic unit (ALU), a floating point unit (FPU), a digital signal processing core (DSP core), or any combination thereof. An example memory controller 1118 may also be used with processor 1104, or in some implementations, memory controller 1118 may be an internal part of processor 1104.

Depending on the desired configuration, system memory 1106 may be of any type including but not limited to volatile memory (such as RAM), non-volatile memory (such as ROM, flash memory, etc.) or any combination thereof. System memory 1106 may include an operating system 1120, one or more applications 1122, and program data 1124. In some embodiments, application 1122 may be arranged to operate with program data 1124 on operating system 1120. This described basic configuration 1102 is illustrated in FIG. 11 by those components within the inner dashed line.

Computing device 1100 may have additional features or functionality, and additional interfaces to facilitate communications between basic configuration 1102 and any required devices and interfaces. For example, a bus/interface controller 1130 may be used to facilitate communications between basic configuration 1102 and one or more data storage devices 1132 via a storage interface bus 1134. Data storage devices 1132 may be removable storage devices 1136, non-removable storage devices 1138, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 1106, removable storage devices 1136 and non-removable storage devices 1138 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 1100. Any such computer storage media may be part of computing device 1100.

Computing device 1100 may also include an interface bus 1140 for facilitating communication from various interface devices (e.g., output devices 1142, peripheral interfaces 1144, and communication devices 1146) to basic configuration 1102 via bus/interface controller 1130. Example output devices 1142 include a graphics processing unit 1148 and an audio processing unit 1150, which may be configured to communicate to various external devices such as a display or speakers via one or more A/V ports 1152. Example peripheral interfaces 1144 include a serial interface controller 1154 or a parallel interface controller 1156, which may be configured to communicate with external devices such as input devices (e.g., keyboard, mouse, pen, voice input device, touch input device, etc.) or other peripheral devices (e.g., printer, scanner, etc.) via one or more I/O ports 1158. An example communication device 1146 includes a network controller 1160, which may be arranged to facilitate communications with one or more other computing devices 1162 over a network communication link via one or more communication ports 1164.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 1100 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1100 may also be implemented as a personal computer including both laptop computer and non-laptop computer configurations.

Although the present disclosure has been described in terms of the above-illustrated embodiments, it will be appreciated that a wide variety of alternate and/or equivalent implementations calculated to achieve the same purposes may be substituted for the embodiments shown and described without departing from the scope of the present disclosure. It is readily appreciated that embodiments in accordance with the present disclosure may be implemented in a very wide variety of embodiments. This description is intended to be regarded as illustrative instead of restrictive.

What is claimed is:

1. A tunnel field-effect transistor (TFET), comprising:
    a substrate;
    a source region;
    a drain region having a first dimension;
    a channel region coupled to the drain region;
    a tunnel region coupled to the source region and the drain region; and
    an oxide region, having a second dimension, wherein:
        the oxide region is positioned laterally relative to the source region, wherein:
        the source region, the drain region, and the channel region are vertically stacked over the substrate, and
        the first dimension of the drain region is equal to the second dimension of the oxide region.

2. The TFET of claim 1, wherein the first dimension of the drain region includes a width of the drain region, and wherein the second dimension of the oxide region includes a width of the oxide region.

3. The TFET of claim 1, wherein the first dimension of the drain region includes a depth of the drain region, and wherein the second dimension of the oxide region includes a depth of the oxide region.

4. The TFET of claim 1, wherein the oxide region is made from a group III-V compound material that has been oxidized.

5. The TFET of claim 1, wherein the tunnel region includes a portion that is coupled to the channel region, wherein the portion of tunnel region has a third dimension, and wherein the third dimension of the portion of the tunnel region is equal to the second dimension of the oxide region.

6. The TFET of claim 1, wherein the oxide region is positioned to operate as an insulator to limit an OFF-state leakage current that flows during an OFF-state of the TFET.

7. The TFET of claim 1, further comprising:
    a gate region; and
    a passivation layer, wherein the passivation layer is positioned between the tunnel region and the gate region.

8. The TFET of claim 7, wherein at least one of the drain region, the passivation layer, the channel region, and the tunnel region includes a first compound material, and wherein the source region includes a second compound material.

9. A tunnel field-effect transistor (TFET), comprising:
    a substrate;
    a source region;
    a drain region;
    a channel region coupled to the drain region;
    a tunnel region having a first portion coupled to the channel region;
    an oxide region positioned at least partially under the drain region, the channel region, and the first portion of the tunnel region; and
    a gate region that overlaps with at least a portion of the channel region and at least a second portion of the tunnel region, wherein:
        the drain region, the channel region, the tunnel region, and the source region are made from a first material, and
        the substrate is made from a second material different from the first material.

10. The TFET of claim 9, further comprising:
a gate oxide layer that is positioned between the gate region and one or more of the source region, the tunnel region, the channel region, and the drain region.

11. The TFET of claim 9, further comprising:
a passivation layer positioned between the tunnel region and the gate region.

12. The TFET of claim 11, wherein:
the source region is made from a heavily doped compound material of a first conductivity type,
the drain region is made from a heavily doped compound material of a second conductivity type,
the channel region is made from a lightly doped compound material of the second conductivity type,
the tunnel region is made from the heavily doped compound material of the second conductivity type or from another heavily doped compound material of the second conductivity type, and
the first conductivity type is different from the second conductivity type.

13. The TFET of claim 12, wherein the compound material of the first conductivity type, the compound material of the second conductivity type, and the another compound material of the second conductivity type include group III-V compound materials.

14. The TFET of claim 9, further comprising:
a source contact and a drain contact, wherein the source region is coupled to the source contact, and wherein the drain region is coupled to the drain contact.

15. The TFET of claim 9, wherein the oxide region is positioned to operate as an insulator to limit an OFF-state leakage current that flows during an OFF-state of the TFET.

16. A tunnel field-effect transistor (TFET), comprising:
a first layer having a first portion and a second portion, wherein the first portion of the first layer includes a source region, and wherein the second portion of the first layer includes an oxide region having a first width;
a second layer that includes a tunnel region, wherein the tunnel region includes a first portion having a second width;
a third layer that includes a channel region; and
a fourth layer that includes a drain region, wherein:
the first width is less than or equal to the second width, and
the oxide region, by virtue of the first width, restricts a path of an OFF-state leakage current that flows in the TFET.

17. The TFET of claim 16, wherein the oxide region enables an increase in an ON-state current that flows in the TFET.

18. The TFET of claim 16, further comprising:
a gate region, wherein the gate region is laterally displaced relative to the drain region, and wherein the gate region does not vertically overlie all of the drain region;
a passivation layer positioned between the tunnel region and the gate region; and
a gate oxide layer, wherein the gate oxide layer is positioned between the gate region and any one or more of the source region, the drain region, the channel region, the passivation layer, or the tunnel region.

19. The TFET of claim 16, wherein the drain region, the channel region, and the tunnel region include a material of a first conductivity type, and wherein the source region includes a material of a second conductivity type.

20. The TFET of claim 19, wherein the material of the first conductivity type includes an n type material, and wherein the material of the second conductivity type includes a p type material.

21. The TFET of claim 16, wherein the oxide region is positioned to underlie an entirety of the drain region.

22. The TFET of claim 16, wherein the fourth layer includes a third width, and wherein the first width of the oxide region is 3% to 30% larger than the third width of the fourth layer.

23. The TFET of claim 16, wherein the fourth layer includes a third width that is 3% to 30% larger than the first width of the oxide region.

* * * * *